(12) United States Patent
Skofljanec

(10) Patent No.: US 6,741,476 B2
(45) Date of Patent: May 25, 2004

(54) HOUSING FOR USE IN A VEHICLE TO ACCOMMODATE A PRINTED CIRCUIT BOARD CONTAINING ELECTRONIC COMPONENTS

(75) Inventor: Robert Skofljanec, Moos-Bankholzen (DE)

(73) Assignee: TRW Automotive Electronics & Components GmbH & Co. KG, Radolfzell (DE)

( * ) Notice: Subject to any disclaimer, the term of this patent is extended or adjusted under 35 U.S.C. 154(b) by 0 days.

(21) Appl. No.: 10/207,483

(22) Filed: Jul. 29, 2002

(65) Prior Publication Data

US 2003/0048010 A1 Mar. 13, 2003

(30) Foreign Application Priority Data

Jul. 31, 2001 (DE) .................... 201 12 595 U

(51) Int. Cl.[7] ............... H05K 7/00; H05K 1/14; H05K 5/00; H05K 5/04; H05K 5/06
(52) U.S. Cl. ............. 361/747; 361/732; 361/740; 361/752; 361/759; 361/801; 361/802
(58) Field of Search ................ 361/683, 726, 361/728, 731, 732, 735, 740–742, 747, 752–753, 756, 759, 768–769, 778, 785, 790, 801–802, 807, 820, 829, 711, 719, 720, 684–686, 737; 211/41.17; 312/223.2, 223.3; 36/804, 758, 770; 174/50, 50.51, 50.52, 51

(56) References Cited

U.S. PATENT DOCUMENTS

| | | | | |
|---|---|---|---|---|
| 5,430,618 A | * | 7/1995 | Huang | 361/818 |
| 5,550,712 A | * | 8/1996 | Crockett | 361/752 |
| 6,339,531 B1 | * | 1/2002 | McKain et al. | 361/685 |

FOREIGN PATENT DOCUMENTS

| | | |
|---|---|---|
| DE | 3916899 A1 | 11/1990 |
| DE | 4218112 A1 | 7/1993 |
| DE | 4328488 A1 | 3/1994 |
| DE | 19630173 A1 | 1/1998 |
| DE | 19757005 A1 | 8/1998 |
| DE | 19738803 A1 | 3/1999 |
| DE | 10004196 A1 | 8/2000 |
| DE | 19921819 A1 | 11/2000 |

* cited by examiner

Primary Examiner—Phuong T. Vu
(74) Attorney, Agent, or Firm—Tarolli, Sundheim, Covell & Tummino L.L.P.

(57) ABSTRACT

A housing for use in a vehicle to accommodate a printed circuit board (20, 22) carrying electronic components is provided. The housing has a generally parallelepipedal hood (10) made of plastics and having a plug collar (14) on one of its narrow side walls (12). A base plate closes off the hood (10). The printed circuit board (20) is mechanically and electrically conductively connected on three of the four corners of the hood (10) to a metallic mounting bushing (26). At each of these corners, the hood (10) has a mounting flange (16) and the mounting bushings (26) are anchored in the mounting flanges (16) of the hood (10).

8 Claims, 3 Drawing Sheets

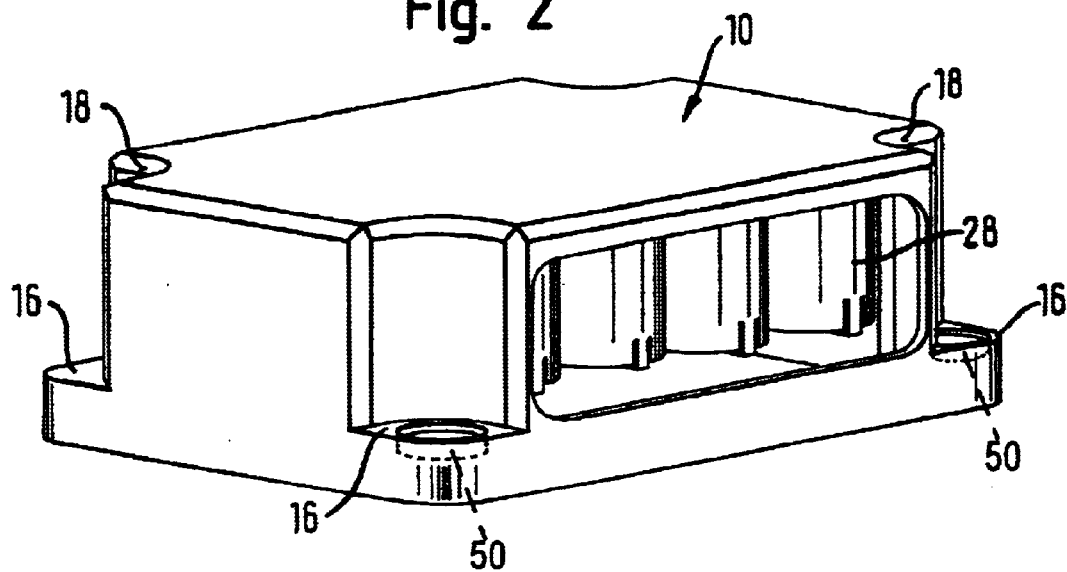
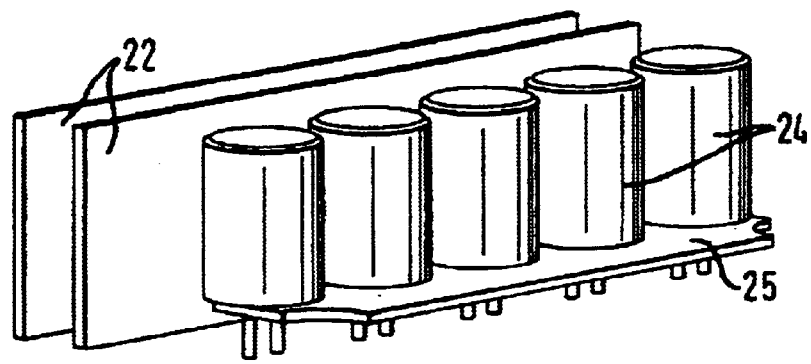
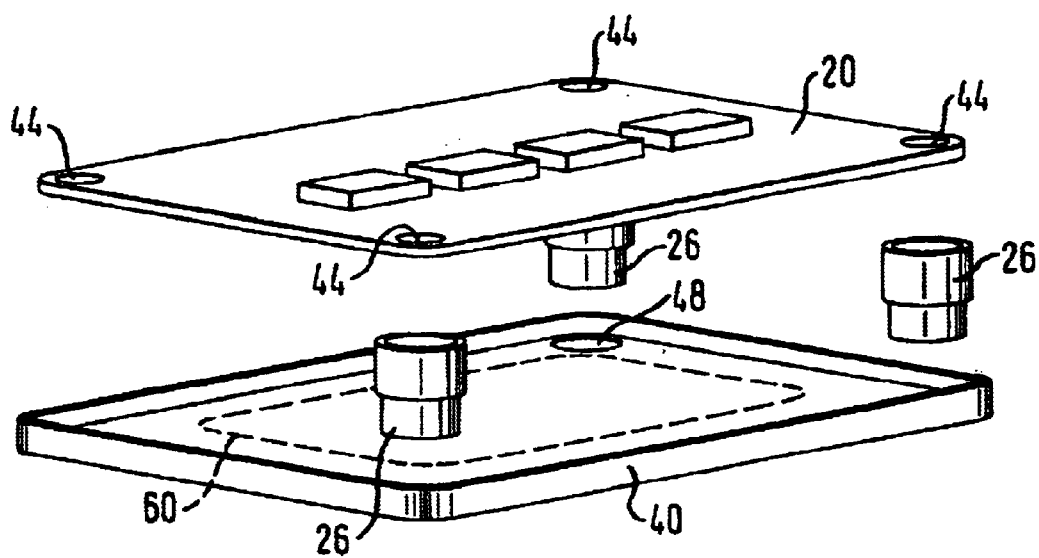

HOUSING FOR USE IN A VEHICLE TO ACCOMMODATE A PRINTED CIRCUIT BOARD CONTAINING ELECTRONIC COMPONENTS

FIELD OF THE INVENTION

The present invention relates to a housing for use in a vehicle to accommodate a printed circuit board carrying electronic components.

BACKGROUND OF THE INVENTION

A wide array of requirements is made of such a housing: for example, it should be as inexpensive to manufacture and should occupy as little space as possible. It is also advantageous if the very same housing can be used, regardless of the installation site, of the installation conditions prevailing there and of the shape of the printed circuit board, or else if the housing can be adapted to the installation conditions and/or to the design of the printed circuit board by means of changes that are easy to effectuate. Housings known so far from the state of the art, for example, have a housing designed as a composite body consisting of a metallic base plate and a plastic body. The base plate projects beyond the plastic body on two sides and, on the projecting edge strips, it has fastening openings by means of which the housing can be fastened, for example, to the car body. The position of the fastening points as well as the outer design of the housing are fixed. The electric contact between the printed circuit board and the base plate is made, for example, by means of a tab that is stamped out of the base plate and that is bent upwards in the direction of the printed circuit board.

SUMMARY OF THE INVENTION

The present invention provides a housing that, with a compact design, offers an optimal printed circuit board utilization and that can be manufactured and mounted especially inexpensively.

According to the invention, the printed circuit board is mechanically and electrically conductively connected on at least three of the four corners of the hood to metallic mounting bushings. At each of these corners, the hood has a mounting flange and the mounting bushings are anchored in the mounting flanges of the hood. The mounting bushings penetrate the openings formed in the printed circuit board. Since the printed circuit board extends to the corners of the base plate and of the hood, and since the base plate does not extend beyond the hood, a very compact housing is formed whose base surface area can be occupied almost entirely by the printed circuit board. At the same time, via the mounting bushings, an electrically conductive connection can be established between the printed circuit board and, for example, the car body. The simple "putting together" of the individual components as well as the small number of different components translate into a rapid, simple and thus inexpensive assembly.

According to a preferred embodiment, the hood has a recess at each of the three corners allowing a tool to gain access to fastening screws that are inserted through the mounting bushings. Thus, the housing can be mounted simply, for example, onto the body of a vehicle.

According to another preferred embodiment, the plug collar is optionally arranged on a long or short narrow side wall of the hood. If it is arranged on a short narrow side, the plug collar extends as far as to the area of that one of the four corners of the hood where no mounting bushing is provided, so that the housing is only fastened via the three remaining mounting bushings. Since only three of the four possible mounting bushings are used for fastening purposes, there is a relatively great freedom in selecting the attachment points. The possibility of attaching the plug collar selectively on either of the two narrow sides that are adjacent to each other makes it possible to adapt the exterior shape of the housing to the installation conditions, and this gives greater freedom in terms of the design of the printed circuit board.

BRIEF DESCRIPTION OF THE DRAWINGS

Additional advantages and characteristics of the invention ensue from the description below of several embodiments and from the accompanying drawings to which reference is made. The drawings show the following:

FIG. 2—an exploded view of the individual components of a housing according to the invention;

DESCRIPTION OF THE PREFERRED EMBODIMENTS

Figure 1:
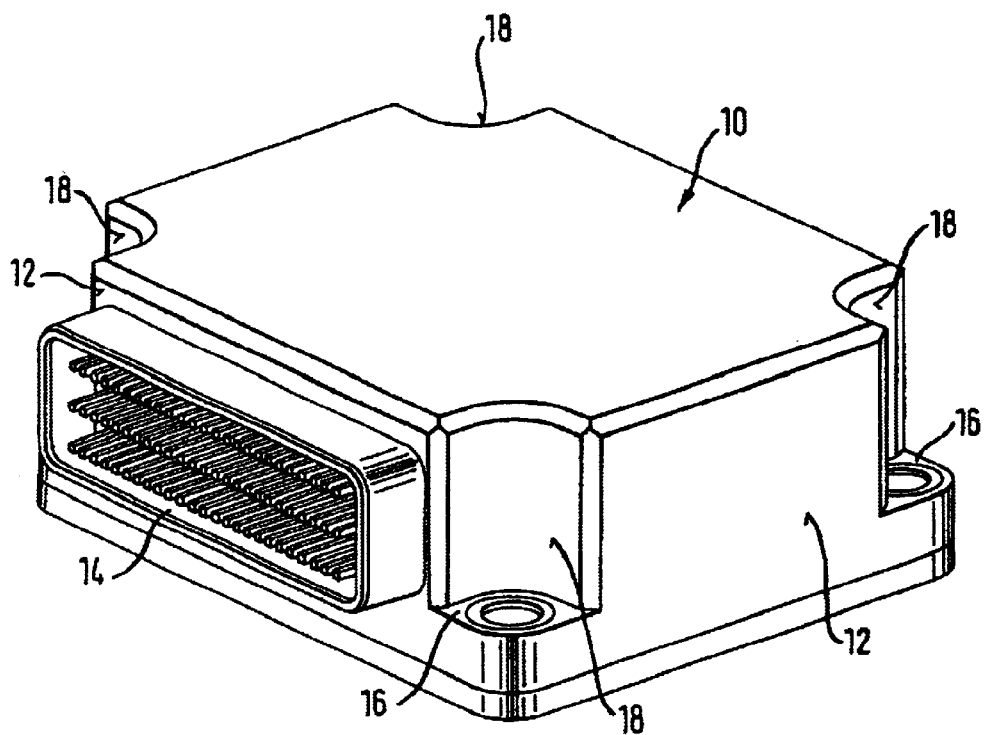
FIG. 1—a perspective view of a generally parallelepipedal hood of a housing according to the invention.

FIG. 1 shows a hood 10 of a housing according to the invention. The generally parallelepipedal hood 10 is made of plastic. A plug collar 14 is inserted into one of its narrow sides 12. The plug collar 14 can also be molded on the hood according to another embodiment. At each of its corners, there is a mounting flange 16. Perpendicular above each mounting flange 16, the hood 10 has indentations 18 that give access to a tool that is needed to mount the housing.

Figure 3:
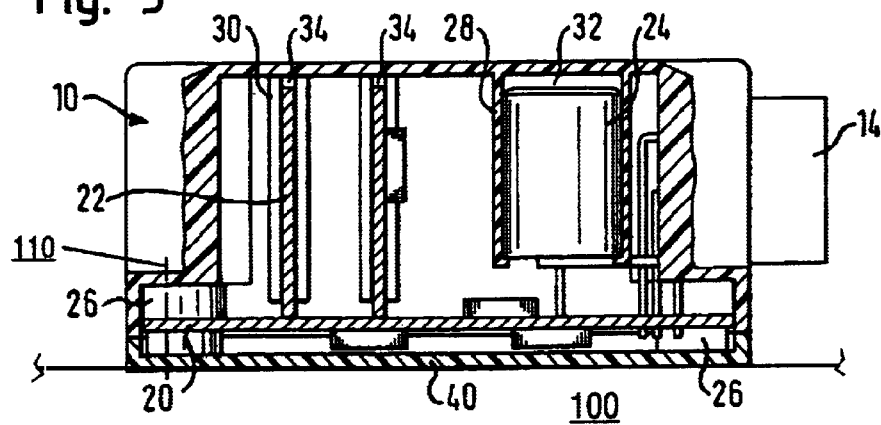
FIG. 3—a schematic sectional view of the housing according to FIG. 2.

The exploded view of FIG. 2 schematically shows the individual components of a housing according to the invention and their interaction. FIG. 3 shows a schematic sectional view of the assembled housing of FIG. 2. In addition to the hood 10 described above, FIG. 2 also shows various printed circuit boards 20, 22 and condensers 24 that are to be accommodated in the housing and that are arranged on a printed circuit board 25, as well as metallic mounting bushings 26 and a base plate 40. In order to accommodate and position the condensers 24 or the printed circuit boards 22, the hood 10 has corresponding receiving elements 29 and 30 (also see FIG. 3) that form recesses 32 and 34 for the condensers 24 and the printed circuit boards 22. After the condensers 24 have been placed into the recesses 32 and the printed circuit boards 22 have been placed into the recesses 34 of the hood 10, the fitted printed circuit board 20 is laid against the mounting flange 16 of the hood 10 from below relative to FIG. 2. If the mounting bushings 26 are molded into the plastic material of the hood, the printed circuit board 20 is placed at openings 44 onto the mounting bushings 26 and connected to the latter, for example, by pressing the mounting bushings 26, so that, in addition to the mechanical connection of the printed circuit board 20 with the metallic mounting bushings 26, an electrically conductive connection can be made to strip conductors on the printed circuit board as well. The four mounting bushings 26 are each conductively connected to each other by means of electric strip conductors on the printed circuit board 20. As an alternative to the embodiment with the mounting bushings that are molded into the plastic material of the hood, it is also provided that, before the printed circuit board 20 is mounted in the housing 10, the mounting bushings 26 are inserted into the openings 44 of the printed circuit board 20 and press-fitted with the latter. In this case, the mounting flanges 16 each have a sealing sleeve 50 made of elastomeric material in order to seal off the housing. These sealing sleeves 50 are preferably manufactured together with the hood by means of two-component injection molding. The mounting bushings 26 that have been pressed onto the printed circuit board 20 are then inserted into the mounting flange 16. In this embodiment, the surface of the mounting bushings that is in contact with the sealing sleeves preferably has a knurled design in order to achieve a better seal.

Subsequently, the base plate 40, which is preferably made of plastic, is placed with its openings 48 onto the mounting bushings 26. The base plate 40 can be attached to the hood 10 by means of conventional methods such as adhesion, laser welding or hot caulking.

By means of fastening screws 110 that are inserted into the mounting flange 16, the assembled housing can then be mounted at the intended location, for example, the car body 100. The installation position and the exterior shape of the housing can be varied independent of the installation site and/or of the installed printed circuit board, as will be explained below with reference to FIG. 4.

FIG. 4 shows two possible variants of the shaping of the plug collar onto the hood and of the position or number of attachment points of the housing.

Figure 4A:
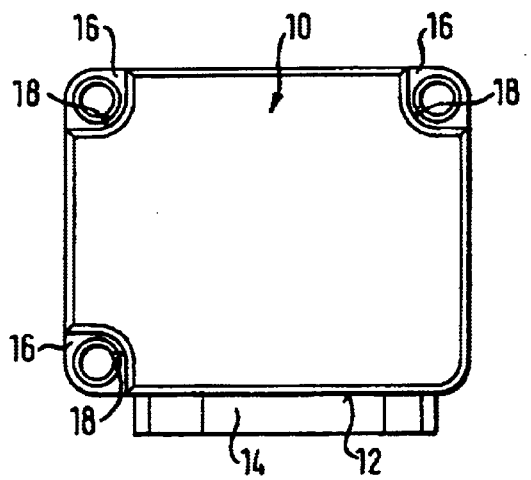
FIGS. 4a to 4c—a schematic view from above of various possibilities for shaping the plug collar onto the hood.
Figure 4B:
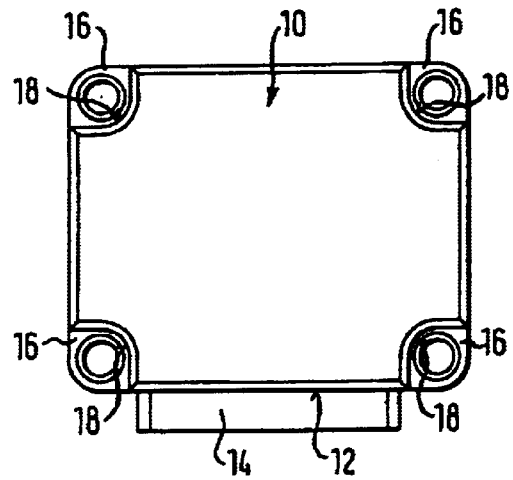

FIGS. 4a and 4b each show the plug collar 14 arranged on one of the long narrow sides 12 of the hood 10. In FIG. 4a, the plug collar 14 extends to the lower right-hand corner of the hood 10 relative to FIG. 4. No mounting flange is present on this corner of the hood 10. The housing can be fastened by means of the three remaining mounting flanges 16 of the hood 10. In FIG. 4b, the plug collar 14 extends between the two lower mounting flanges 26 of the hood 10 so that four mounting flanges 16 are provided and can be used for the attachment of the housing.

Figure 4C:
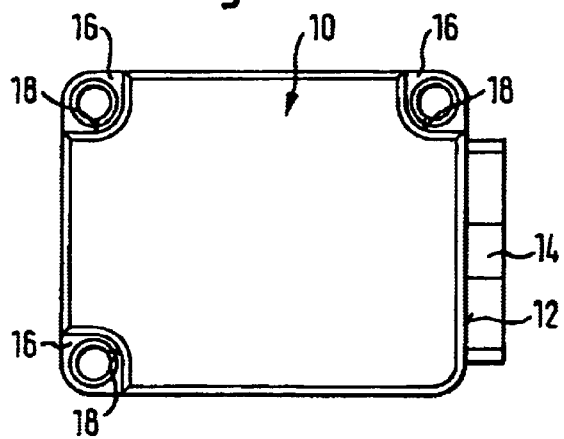

In FIG. 4c, the plug collar 14 is arranged on one of the short narrow sides 12 of the hood 10. Relative to FIG. 4, it extends to the lower right-hand corner of the hood 10 on which there is no mounting flange. Like in FIG. 4a, only three mounting flanges 16 are provided for the attachment of the housing. Since the plug collar 14, unlike FIG. 4a, is situated on one of the short narrow sides of the hood 10 and not on one of the long narrow sides of the hood 10, the length of the plug collar 14 as well as the entire exterior shape of the housing can,be changed by varying the position of the plug collar.

According to the invention, it is also provided that the base plate 40 is optionally configured thinner in certain areas so that, for repair purposes, the base plate 40 can be broken open at the thinner areas 60 and the printed circuit boards 20, 22, 25 or the condensers 24 can be removed.

What is claimed is:

1. A housing for use in a vehicle to accommodate a printed circuit board with electronic components mounted thereon, comprising a rectangular base plate and a generally parallelepipedal hood of plastic with four corners and an open side, said open side being closed by said base plate, said hood having an integrally molded mounting flange at least at each of three of the four corners for mounting said housing to a vehicle, said housing further comprising metallic mounting bushings with a through hole and being anchored in each of said mounting flanges, said printed circuit board and said base plate having a mounting hole at each of three corners corresponding to said three corners of said hood, each metallic mounting bushing having a tubular extension that projects from said hood and extends through a corresponding mounting hole of said printed circuit board and through a corresponding mounting hole of said base plate, at least one of said metallic mounting bushings being mechanically attached and electrically connected to said printed circuit board thereby fixing said printed circuit board with respect to said hood and said base plate, and said housing being mounted to a vehicle by means of fastening means inserted into said mounting flanges and extending through said through holes of said mounting bushings.

2. The housing of claim 1, wherein said hood has a part-cylindrical recess at each of said three corners to permit access with a tool to a mounting screw extending through a respective mounting bushing.

3. The housing of claim 1, wherein said mounting bushings are press-fitted with said printed circuit board.

4. The housing of claim 1, wherein said mounting bushings are molded into the plastic material of said hood.

5. The housing of claim 1, wherein each mounting bushing is inserted in a through hole of a corresponding mounting flange of said hood with an annular seal engaged around said bushing and into said through hole.

6. The housing of claim 1, wherein each mounting bushing is inserted in a through hole of a corresponding mounting flange of said hood with an annular seal engaged around said bushing and integrally molded with said hood by a two-component injection method.

7. The housing of claim 1, wherein said base plate and said hood are connected with each other by welding.

8. A housing for use in a vehicle to accommodate a printed circuit board with electronic components mounted thereon, comprising a rectangular base plate and a generally parallelepipedal hood of plastic with four corners and an open side, said open side being closed by said base plate, said hood having a major top wall and two pairs of opposed side walls, said hood having integrally molded mounting flanges at only three of the four corners, each mounting flange extending from said one corner at which said mounting flange is arranged along a first side wall adjacent to said one corner and along a second side wall adjacent to said one corner, said housing further comprising a plug collar which is provided on a side wall which is adjacent to only one of said three corners at which said mounting flanges are arranged, said plug collar extending from one of said mounting flanges to said corner of said hood at which no mounting flange is arranged, said housing further comprising a metallic mounting bushing comprising a through hole and being anchored in each of said mounting flanges, said printed circuit board and said base plate having a mounting hole at each of three corners corresponding to said three corners of said hood, each metallic mounting bushing having a tubular extension that projects from said hood and extends through a corresponding mounting hole of said printed circuit board and through a corresponding mounting hole of said base plate, and at least one of said metallic mounting bushings being mechanically attached and electrically connected to said printed circuit board.

* * * * *